(12) United States Patent
Enguent

(10) Patent No.: US 6,236,220 B1
(45) Date of Patent: *May 22, 2001

(54) METHOD FOR THE TESTING OF AN INDUCTIVE RESONANT CIRCUIT

(75) Inventor: Jean-Pierre Enguent, Saint Savournin (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/193,272

(22) Filed: Nov. 17, 1998

(30) Foreign Application Priority Data

Nov. 17, 1997 (FR) .................................................. 97 14687

(51) Int. Cl.[7] ...................................................... G01R 27/28
(52) U.S. Cl. ............................................................. 324/652
(58) Field of Search .................................. 324/652, 71.1, 324/248, 635, 727, 708, 520

(56) References Cited

U.S. PATENT DOCUMENTS 3,840,805 * 10/1974 Martyashin et al. ................. 324/652
4,392,106    7/1983  Yakovlev et al. .
4,973,912 * 11/1990 Kaminski et al. ................... 324/652
5,631,572    5/1997  Sheen et al. .
5,898,298 *  4/1999  Brandsma et al. ................... 324/652

OTHER PUBLICATIONS

Patent Abstracts of Japan, vol. 018, No. 272, May 24, 1994 and JP 06 047513 A (Sumitomo Light Metal Ind. Ltd.), Feb. 22, 1994.

* cited by examiner

*Primary Examiner*—Safet Metjahic
*Assistant Examiner*—J Kerveros
(74) *Attorney, Agent, or Firm*—Theodore E. Galanthay; Allen, Dyer, Doppelt, Milbrath & Gilchrist, P.A.

(57) ABSTRACT

A method for testing whether an antenna circuit of a contactless chip card is defective. The antenna circuit is an inductive resonant circuit comprising a capacitor and an antenna coil. The antenna coil of the resonant circuit is excited by inductive coupling using a test coil wherein the excitation is then sharply interrupted. By detecting in the test coil a response signal generated by self-induction in the antenna coil of the resonant circuit and retransmitted to the test coil by inductive coupling, the response signal can be analyzed for determining whether a contactless chip card is defective. Application is well suited to the testing of antenna circuits for electronic portable devices working without contact, such as contactless chip cards, electronic labels, etc.

26 Claims, 1 Drawing Sheet

FIG.1
(PRIOR ART)
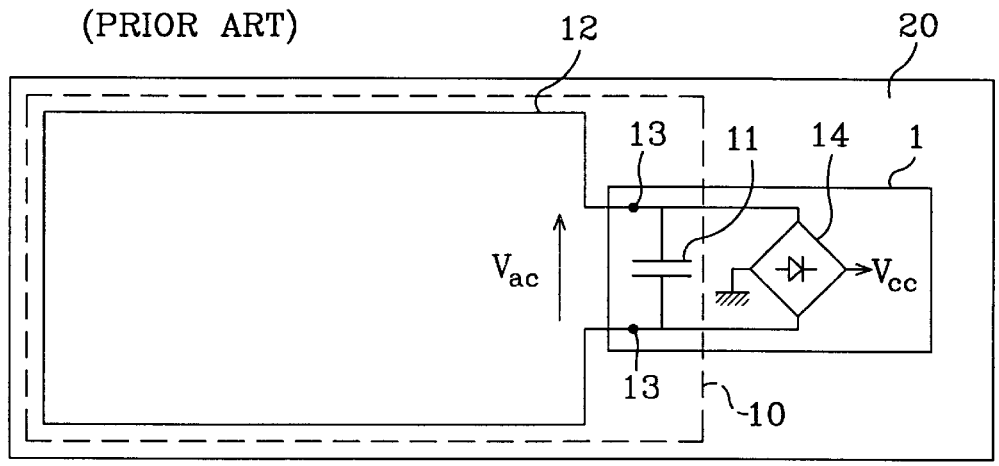
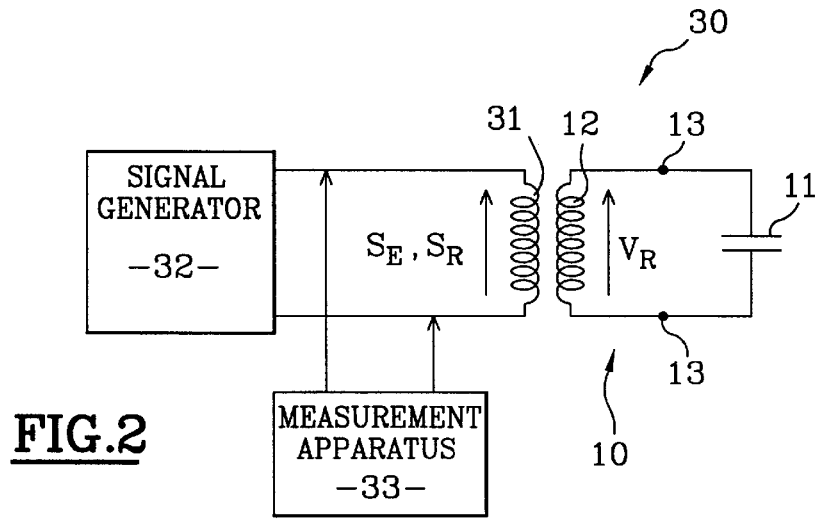
FIG.2
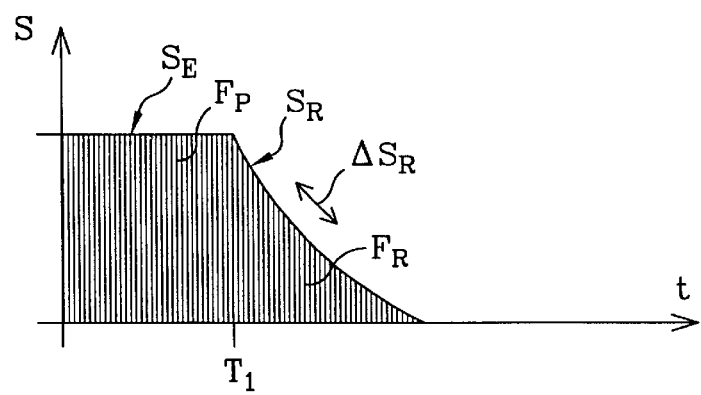
FIG.3

METHOD FOR THE TESTING OF AN INDUCTIVE RESONANT CIRCUIT

FIELD OF THE INVENTION

The present invention relates to circuit testing and, more particularly, to a method of testing an inductive resonant circuit, especially to the testing of antenna circuits of portable devices, such as contactless chip cards, electronic labels, etc.

BACKGROUND OF THE INVENTION

FIG. 1 is a schematic view of a structure of an integrated circuit 1 working without contact, mounted for example, on a plastic card 20 to form a contactless chip card. This integrated circuit 1 is provided with an antenna circuit 10 comprising a capacitor 11 integrated into the silicon of the integrated circuit 1 and an antenna coil 12. The antenna coil 12 is mounted on the plastic card 20 and is connected to the terminals of the capacitor 11 by means of connection pads 13 by tin/lead soldering or ultrasonic soldering. The antenna circuit 10 is a resonant circuit whose nominal resonance frequency Fp is generally 13.56 MHz according to prevailing standards. When the antenna coil 12 is placed in an alternating magnetic field Fld locked into the frequency Fp, an alternating voltage Vac appears at its terminals by electromagnetic induction. This alternating voltage Vac could reach 20 to 40 volts under efficient conditions of operation and is converted by a rectifier circuit 14 into a direct voltage Vcc for the integrated circuit.

In general, the antenna coil 12 is not connected to the pads 13 of the integrated circuit 1 except when the integrated circuit 1 is mounted on the plastic card 20 during an advanced stage of manufacturing. The integrated circuit 1 is then covered with a protective resin. At this stage, and despite various controls that may have been planned during the previous steps, occasionally the connection of the antenna coil 12 is faulty, or the integrated capacitor 11 does not have its nominal value. This may be so, for example, because of a drift in the application of the method of manufacture of the integrated circuit. It is therefore desirable to detect these anomalies.

SUMMARY OF THE INVENTION

A object of the present invention is to provide a testing method for determining whether the antenna coil of a contactless chip card, and more generally, a contactless electronic portable device, is defective. More generally, the present invention is aimed at enabling non-visual checking of an inductive resonant circuit. To attain this objective, the present invention relies on the straightforward, but nonetheless, elegant concept of exciting the resonant circuit by inductive coupling and then observing the reaction of the resonant circuit, also by inductive coupling.

More particularly, the present invention provides for a method to test an inductive resonant circuit comprising a capacitor and an antenna coil. The method comprises the steps of exciting the resonant circuit by inductive coupling using a test coil positioned adjacent to the coil of the resonant circuit; sharply interrupting the excitation of the resonant circuit; and then detecting in the test coil a response signal generated by self-induction in the coil of the resonant circuit and retransmitted to the test coil by inductive coupling.

Preferably, the resonant circuit is excited by applying to the test coil a signal at the presumed resonance frequency of the resonant circuit. In practice, the period of excitation of the resonant circuit may be short, and less than one second. If no response signal is detected, the resonant circuit may be considered to be out of operation. If not, the response signal may be analyzed to determine its speed of decrease. When the speed of decrease of the response signal is above a predetermined threshold, the resonant circuit may be considered to be out of operation. Also, the response signal may be analyzed to determine its oscillation frequency. When the oscillation frequency of the response signal is substantially different from the presumed resonance frequency, the resonant circuit may be considered to be out of operation.

BRIEF DESCRIPTION OF THE DRAWINGS

These various aspects of the invention, as well as others, are explained in greater detail in the following description of the test method according to the invention, with reference to the appended figures, of which:

FIG. 1 shows an antenna circuit of an electronic portable device working without contact, as in the prior art;

FIG. 2 shows a test assembly for implementing a method according to the invention; and FIG. 3 shows a curve as a function of time of a test signal according to the invention.

DETAILED DESCRIPTION OF THE PREFERRED EMBODIMENTS

FIG. 2 represents a testing system 30 used to implement the method according to the invention. This system 30 comprises a test coil 31, a signal generator 32 and a measurement apparatus 33. The test coil 31 is connected to the output of the signal generator 32 and the measurement apparatus 33 is connected to the terminals of the test coil 31. In the vicinity of the test coil 31, there is an antenna coil 12 of an antenna circuit 10 of the type described in the introduction. The antenna circuit 10 comprises a silicon capacitor 11 of an integrated circuit working without contact.

In a first step, the test coil 31 is excited by means of a signal SE (voltage or current) with a duration T1 to transmit and accumulate inductive energy in the antenna coil 12. The signal SE is preferably alternating and tuned to the presumed resonance frequency Fp of the antenna circuit 10, which is typically 13.56 MHz according to prevailing standards. To better illustrate, FIG. 3 shows the shape of the signal SE. The period T1 of application of the excitation signal may be short and less than one second, for example, about 100 milliseconds.

In a second step, the excitation signal SE is sharply interrupted and a response signal SR appearing at the terminals of the test coil 31 is observed by means of the measurement apparatus 33. This response signal SR (which can be observed in voltage or current) is a replica of a reaction voltage VR that appears by self-induction in the antenna coil 12 following the sudden interruption of the excitation signal SE. As can be seen in FIG. 3, the response signal SR is decreasing and alternating. Its speed of decrease ΔSR is a function of time and represents the serial resistance of the antenna circuit 10. Its oscillation frequency FR is the natural frequency of the antenna coil 12, namely:

$$F_R = [2\pi]^{-1} \times [LC]^{-\frac{1}{2}}$$

C being the value of the capacitance 11 and L the inductance of the antenna coil 12.

Advantageously, observation of the response signal SR and measurement of the parameters ΔSR and FR are used to verify that the antenna circuit 10 conforms to preset quality standards. In particular, the speed of decrease ΔSR is considered to be acceptable if it is below a threshold value ΔSR0. Also, the natural frequency FR is considered to be acceptable if it is substantially equal, i.e., in a specific domain of tolerance (for example, a tolerance of plus or minus 20%) to the desired the frequency rate Fp.

In practice, there are four cases that can be observed in this way:

1) The speed of decrease ΔSR is below the threshold ΔSR0 and the frequency FR is substantially equal to the nominal frequency Fp (within the range of tolerance). The antenna circuit 10 is considered to be good and the portable device obtained through this antenna circuit will be suitable for commercial distribution.

2) No response signal is detected. In this case, the antenna circuit 10 is an open circuit and does not work. This is also the case when the soldering of the antenna coil 12 to the connection pads 13 is defective. Since the test according to the invention generally comes into play in the final stage of production, the portable object comprising an antenna coil of this kind will be generally discarded.

3) The frequency FR is substantially equal to the nominal frequency Fp but the speed of decrease ΔSR is above the threshold ΔSR0. This means that the antenna circuit 10 has a damping factor that is excessive because of parasitic resistors other than the serial resistor of the antenna coil 12 and the intrinsic resistor of the silicon capacitor 11, which are taken into account for determining the threshold ΔSR0. In general, the reason of this anomaly is because the soldering of the antenna coil 12 to the pads 13 is defective (for example, a "dry" tin/lead soldering or ultrasonic soldering that has poorly adhered) and has a high serial resistance. The antenna circuit 10 is then considered to be out of operation and the portable object is discarded.

4) The decreasing speed ΔSR is below the threshold ΔSR0, but the frequency FR is substantially different from the nominal frequency Fp (outside the field of tolerance). This means that the integrated capacitor 11 is not at its normal value designed by fabrication. If this anomaly is observed on several antenna circuits 10, it means that the manufacturing method of the capacitor 11 is undergoing a deviation and that corrective action has to be planned. In any case, this antenna circuit 10 may be considered to be out of operation. Indeed, a mismatched antenna circuit 10 delivers an induced voltage Va in the presence of a magnetic field that is too low to provide for the electrical supply of a contactless integrated circuit.

The present invention provides a simple and practical method to find out if the characteristics of an inductive resonant circuit fall within a range of tolerances. Furthermore, the method according to the invention does not require any visual controls and lends itself well to automation in a production line. For example, it is planned, according to one embodiment, that contactless chip cards will be conveyed by a conveyor means to a testing station of the type shown in FIG. 2. The arrival of each card is detected by a photoelectric cell which activates the generation of an excitation signal SE and the analysis of the response signal SR. To provide for efficient inductive coupling with the antenna circuits of the chip cards, the test coil 12 is preferably flat and positioned above or below the conveyer means, at a distance of some millimeters from these means.

Finally, it is proposed to excite the antenna circuit 10 by means of the signal SE tuned to the presumed resonance frequency Fp. The advantage of this method is that the maximum inductive energy is sent into the antenna coil 12 in a very short period of time. However, it is within the scope of the present invention to provide for another type of excitation signal. For example, a square-wave non-oscillating signal. Although such a signal is less efficient, it may enable the testing of antenna circuits that have different resonant frequencies or antenna circuits whose resonant frequency is not known in principle.

That which is claimed is:

1. A method for testing a resonant antenna circuit of an integrated circuit chip, the resonant antenna circuit comprising a capacitor and an antenna coil, the method comprising:
   positioning a removable test coil adjacent the antenna coil;
   exciting the resonant antenna circuit at a presumed resonant frequency of the antenna circuit by coupling between the removable test coil and the antenna coil;
   sharply interrupting excitation of the resonant antenna circuit;
   detecting in the removable test coil if a response signal generated by self-induction in the antenna coil of the resonant antenna circuit is retransmitted to the removable test coil by coupling;
   analyzing whether the response signal corresponds to the presumed resonant frequency; and
   removing the removable test coil from adjacent the antenna coil.

2. A method according to claim 1, further comprising determining the resonant antenna circuit to be out of operation when no response signal is detected.

3. A method according to claim 1, wherein analyzing the response signal comprises determining a rate of decrease in voltage or current thereof.

4. A method according to claim 3, further comprising determining the resonant antenna circuit to be out of operation when the rate of decrease is above a predetermined threshold.

5. A method according to claim 1, wherein analyzing the response signal comprises determining an oscillation frequency thereof.

6. A method according to claim 5, further comprising determining the resonant antenna circuit to be out of operation when the oscillation frequency of the response signal is different from the presumed resonant frequency of the resonant antenna circuit.

7. A method according to claim 1, wherein the exciting is for less than about one second.

8. A method according to claim 1, wherein the inductive resonant circuit is an antenna circuit of a portable electronic device.

9. A method according to claim 1, wherein the test coil is a flat coil.

10. A method for testing a resonant antenna circuit of an integrated circuit chip comprising a capacitor and an antenna coil, the method comprising:
   Positioning a removable test coil adjacent the antenna coil;
   exciting the resonant antenna circuit at a presumed resonant frequency of the antenna circuit by coupling between the removable test coil and the antenna coil;
   interrupting excitation of the resonant antenna circuit;
   detecting in the removable test coil if a response signal generated by self-induction in the antenna coil of the resonant antenna circuit is retransmitted to the removable test coil by coupling; and analyzing whether the response signal corresponds to the presumed resonant frequency.

11. A method according to claim 10, further comprising determining the resonant antenna circuit to be out of operation when no response signal is detected.

12. A method according to claim 10, wherein analyzing comprises determining a rate of decrease in voltage or current of the response signal.

13. A method according to claim 12, further comprising determining the resonant antenna circuit to be out of operation when the rate of decrease is above a predetermined threshold.

14. A method according to claim 10, further comprising removing the removable test coil from adjacent the antenna coil.

15. A method according to claim 10, wherein analyzing comprises determining an oscillation frequency of the response signal.

16. A method according to claim 15, further comprising determining the resonant antenna circuit to be out of operation when the oscillation frequency is different from the predetermined resonant frequency of the resonant antenna circuit.

17. A method according to claim 10, wherein exciting is for less than about one second.

18. A method according to claim 10, wherein the test coil is a flat coil.

19. A test apparatus for testing a resonant antenna circuit of an integrated circuit chip comprising a capacitor and an antenna coil, the test apparatus comprising:

a removable test coil for positioning adjacent the antenna coil;

a signal generator coupled to the removable test coil for exciting the resonant antenna circuit at a presumed resonant frequency of the antenna circuit by coupling between the removable test coil and the antenna coil; and a measurement circuit for measuring in the removable test coil if a response signal generated by self-induction in the antenna coil of the resonant antenna circuit is retransmitted to the removable test coil by coupling.

20. A test apparatus according to claim 19, wherein the measurement circuit determines the resonant antenna circuit to be out of operation when no response signal is detected.

21. A test apparatus according to claim 19, wherein the measurment circuit analyzes the response signal to determine a rate of decrease in voltage or current.

22. A test apparatus according to claim 21, wherein the measurement circuit determines the resonant antenna circuit to be out of operation when the rate of decrease of the response signal is above a predetermined threshold.

23. A test apparatus according to claim 19, wherein the measurment circuit analyzes the response signal to determine an oscillation frequency.

24. A test apparatus according to claim 23, wherein the measurement circuit determines the resonant antenna circuit to be out of operation when the oscillation frequency of the response signal is different from the predetermined resonant frequency of the resonant antenna circuit.

25. A test apparatus according to claim 19, wherein the signal generator excites the resonant antenna circuit less than about one second.

26. A test apparatus according to claim 19, wherein the test coil is a flat coil.

* * * * *

UNITED STATES PATENT AND TRADEMARK OFFICE
CERTIFICATE OF CORRECTION

PATENT NO. : 6,236,220 B1
DATED : May 22, 2001
INVENTOR(S) : Enguent

Page 1 of 1

It is certified that error appears in the above-identified patent and that said Letters Patent is hereby corrected as shown below:

<u>Title page, Item [30],</u>
Foreign Application Priority Data, delete "17" in Nov. 17, 1997 insert -- 18 --

Signed and Sealed this

Thirtieth Day of October, 2001

*Attest:*

*Attesting Officer*

NICHOLAS P. GODICI
*Acting Director of the United States Patent and Trademark Office*